(12) United States Patent
Kariyazaki

(10) Patent No.: US 7,986,038 B2
(45) Date of Patent: Jul. 26, 2011

(54) ELECTRONIC DEVICE AND LID

(75) Inventor: Shuuichi Kariyazaki, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/588,687

(22) Filed: Oct. 23, 2009

(65) Prior Publication Data
US 2010/0109152 A1    May 6, 2010

(30) Foreign Application Priority Data

Oct. 30, 2008  (JP) ................................. 2008-279489

(51) Int. Cl.
*H01L 23/12* (2006.01)
(52) U.S. Cl. ........................................ 257/704; 257/706
(58) Field of Classification Search .................. 257/704, 257/706, 707, 730, 710
See application file for complete search history.

(56) References Cited

U.S. PATENT DOCUMENTS

| 5,977,626 | A  * | 11/1999 | Wang et al. ............... 257/707 |
| 6,376,907 | B1 * | 4/2002  | Takano et al. .............. 257/704 |
| 6,605,492 | B2 * | 8/2003  | Barrett ..................... 438/126 |
| 6,700,068 | B2 * | 3/2004  | Hoffmeyer et al. ........... 174/250 |
| 6,747,350 | B1 * | 6/2004  | Lin et al. ................. 257/704 |
| 7,057,276 | B2 * | 6/2006  | Lin et al. ................. 257/707 |
| 7,161,238 | B2 * | 1/2007  | Hsieh et al. ............... 257/704 |
| 7,196,414 | B2 * | 3/2007  | Lin et al. ................. 257/707 |
| 7,253,515 | B2   | 8/2007  | Horie et al. |
| 7,323,769 | B2 * | 1/2008  | Tan et al. ................. 257/684 |
| 7,576,427 | B2 * | 8/2009  | Potter ..................... 257/710 |

FOREIGN PATENT DOCUMENTS

| JP | 2000-200870 | 7/2000 |
| JP | 2007-42719  | 2/2007 |

* cited by examiner

*Primary Examiner* — S. V Clark
(74) *Attorney, Agent, or Firm* — McGinn IP Law Group, PLLC

(57) ABSTRACT

The present invention can prevent a lid from tilting when the lid is attached to a substrate. An electronic device 200 includes: a substrate 202; an electronic component mounted on the substrate 202; and a lid 100 including a cover portion 102 protruding in a direction opposite the substrate 202 and covering the electronic component and a flange portion 104 arranged at the periphery of the cover portion 102 and adhered to the substrate 202. A protrusion portion 106 protruding for a predetermined height in a direction of the substrate 202 compared to other areas of the flange portion 104 is arranged on the flange portion 104 of the lid 100.

20 Claims, 6 Drawing Sheets

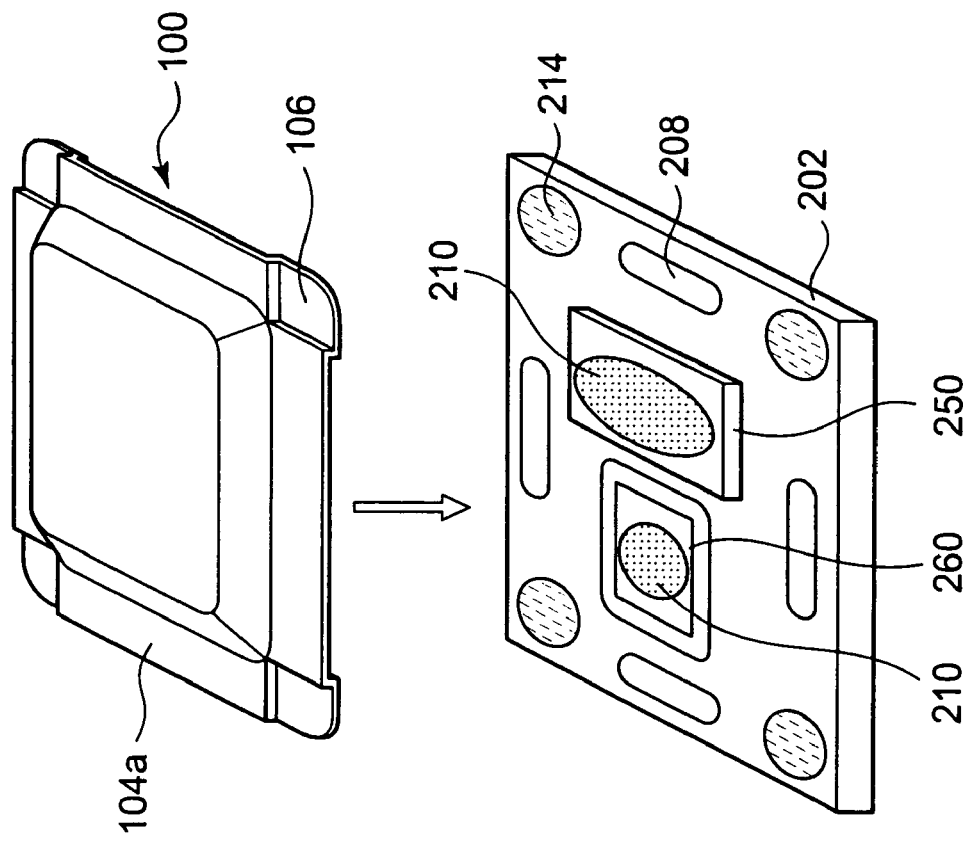
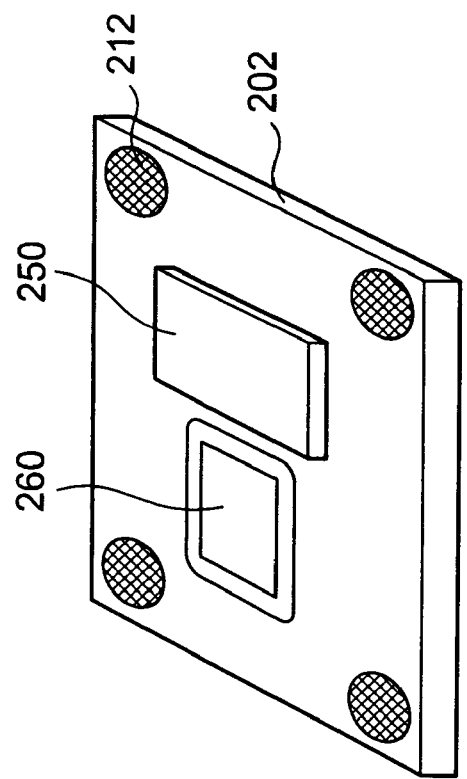

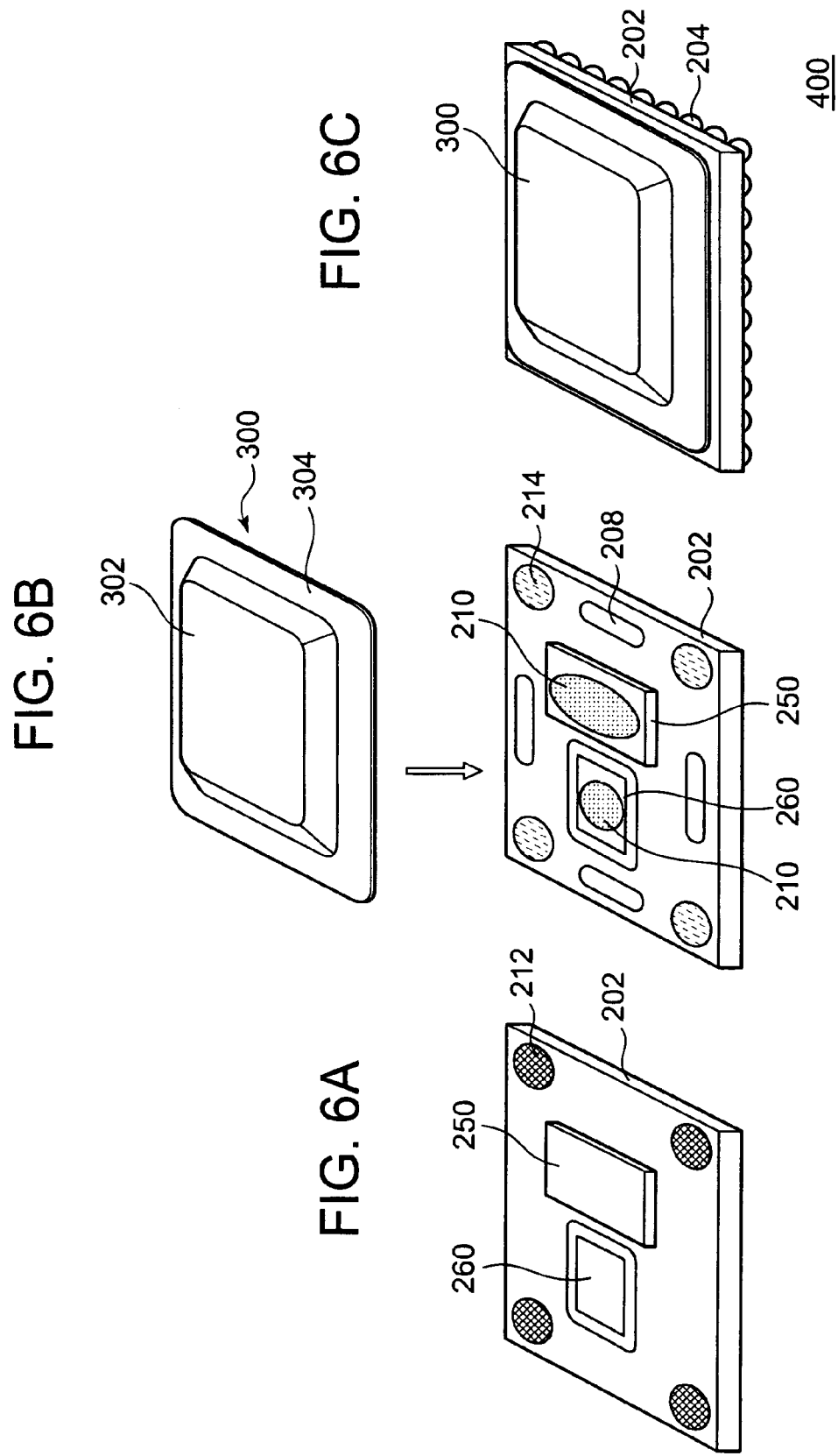

ELECTRONIC DEVICE AND LID

BACKGROUND OF THE INVENTION

1. Field of the Invention

The present invention relates to an electronic device and a lid.

2. Description of the Related Art

A technique for mounting electronic components such as semiconductor chips on a substrate and arranging a lid on the substrate to cover the electronic components for sealing is known.

Japanese Patent Laid-Open No. 2007-42719 describes a semiconductor device comprising: a semiconductor package substrate mounted with a semiconductor element; and a lid including a concave portion and a flange portion, the concave portion accommodating the semiconductor element at a center part and including an adhesive side adhered to the semiconductor element, the flange portion located at the periphery of the concave portion and including an adhesive side adhered to the semiconductor package substrate, wherein the semiconductor package substrate and the lid cover the semiconductor element. The relationship between a depth d1 (μm) from the adhesive side of the flange portion to the adhesive side of the concave portion and a length d2 (μm), which is a sum of a height from the adhesive side of the semiconductor package substrate adhered with the flange portion to the adhesive side of the semiconductor element adhered to the concave portion and a thickness of an adhesive filled between the semiconductor element and the concave portion, is 25 μm≦d2−d1≦300 μm. According to the technique, the concave portion of the lid and the semiconductor element can be closely attached to the adhesive when the lid is adhered to the semiconductor package substrate mounted with the semiconductor element, and the semiconductor element and the lid can be surely attached.

Japanese Patent Laid-Open No. 2000-200870 discloses a configuration in which a reinforcing plate is attached by a conductive adhesive resin on a substrate mounted with a semiconductor chip so as to surround the space mounted with the semiconductor chip, a conductive lid member is fixed on the semiconductor chip through a conductive adhesive resin, and the upper side of the reinforcing plate is also adhered to the lid member by the conductive adhesive resin. In the configuration, the reinforcing plate is connected to a ground electrode of a wiring pattern of the substrate for shielding.

However, conventionally, there id a problem that the lid tilts when the lid is attached to the substrate.

FIG. 5 is a cross sectional view of a configuration of an electronic device in which a plurality of electronic components with different heights are mounted on a substrate. An electronic device 10 includes a substrate 2, electronic components 60 and 62 mounted on the substrate 2, and a lid 50. The lid 50 protrudes in the direction opposite the substrate 2 and includes a cover portion 52 covering the electronic components 60 and 62 and a flange portion 54 arranged at the periphery of the cover portion 52 and adhered to the substrate 2.

Solder balls 4 are arranged on the side opposite the side mounted with the electronic components 60 and 62 of the substrate 2. The electronic component 60 is electrically connected to the substrate 2 through solder balls 64. The electronic component 62 is electrically connected to the substrate 2 in flip chip implementation and is adhered to the substrate 2 by an underfill 66.

In the electronic device 10 configured this way, an adhesive 8 is applied to a part facing the flange portion 54 of the lid 50 on the upper side of the substrate 2. A heat dissipation paste 12 is applied to the upper sides of the electronic components 60 and 62. To maintain the strength of the lid 50 and to provide excellent heat dissipation for the electronic components, the heat dissipation paste 12 contacts the electronic components and the lid 50 when the lid 50 is attached to the substrate 2. Therefore, a sufficient thickness of heat dissipation paste 12 is applied to the electronic components. In this condition, the lid 50 is attached to the substrate 2. This leads the lid 50 to adhere to the substrate 2 through the adhesive 8. The heat dissipation paste 12 is arranged between the electronic components 60 and 62 and the lid 50. This can release the heat generated by the electronic components 60 and 62 through the lid 50.

However, since the lid 50 contacts the heat dissipation paste 12 upon the attachment to the substrate 2, there is a problem that the lid 50 is affected by the variation in the upper side height of the heat dissipation paste 12 on the electronic components, and the lid 50 tilts upon the attachment. Especially, the lid 50 tends to tilt against the substrate 2 when a plurality of electronic components with different height are mounted on the substrate 2, or when the electronic components are not arranged at the center of the substrate 2. Conventionally, the tilted lid 50 is adhered to the substrate 2 through the adhesive 8. However, if the lid 50 tilts and the interval between the lid 50 and the substrate 2 becomes wide, the adhesive 8 does not sufficiently spread between the substrate 2 and the lid 50, and an adhesion failure occurs. Furthermore, when the lid 50 tilts, there may be a problem that the adhesion between the heat dissipation paste 12 and the lid 50 is insufficient, causing the heat dissipation characteristics to degrade. Furthermore, when the lid 50 is tilted, there is a problem that the flatness defined in product specifications is not satisfied.

SUMMARY

The present invention provides an electronic device comprising: a substrate; an electronic component mounted on the substrate; and a lid including a cover portion protruding in a direction opposite the substrate and covering the electronic component and a flange portion arranged at the periphery of the cover portion and adhered to the substrate, wherein a protrusion portion protruding for a predetermined height in a direction of the substrate compared to other areas of the flange portion is arranged on the flange portion of the lid.

The present invention provides a lid arranged on a substrate mounted with an electronic component and covering the electronic component, the lid comprising: a cover portion protruding in a first direction so as to cover the electronic component when arranged on the substrate; and a flange portion including a protrusion portion arranged at the periphery of the cover portion and protruding for a predetermined height in a second direction opposite the first direction compared to other areas.

In this way, the lid can be adhered to the substrate without being tilted against the substrate by arranging the protrusion portion on part of the flange portion of the lid to press the lid against the substrate, the protrusion portion of the lid serving as a supporting point when the lid is attached to the substrate. The interval between the substrate and the area of the flange portion other than the protrusion portion can be maintained.

As a result, the adhesive can be uniformly spread between the substrate and the area of the flange portion other than the protrusion portion, and the connection reliability of the lid can be secured. The distances between the upper sides of the electronic components and the cover portion of the lid differ depending on the heights of the electronic components. The configuration described above can improve the degree of certainty that the upper sides of the electronic components and the planar surface of the cover portion of the lid are parallel. Therefore, the distances between the upper sides of the electronic components and the planar surface of the cover portion of the lid can be accurately predicted even if electronic components with different heights are mounted on the substrate. Thus, the film thickness of the heat dissipation paste can be easily controlled to reduce the variations in the upper side heights of the heat dissipation paste, and the heat dissipation paste and the lid can sufficiently make contact. As a result, excellent heat dissipation characteristics can be provided.

Arbitrary combinations of the constituent elements and conversions of the expression of the present invention between methods and apparatuses are also effective as aspects of the present invention.

The present invention can prevent the lid from tilting when the lid is attached to a substrate.

BRIEF DESCRIPTION OF THE DRAWINGS

FIGS. 4A and 4B are perspective views showing a manufacturing procedure of the electronic device according to the embodiment of the present invention;

FIGS. 6A to 6C are perspective views showing a manufacturing procedure of an electronic device according to a second embodiment of the present invention.

DETAILED DESCRIPTION OF THE PREFERRED EMBODIMENTS

Figure 1A:
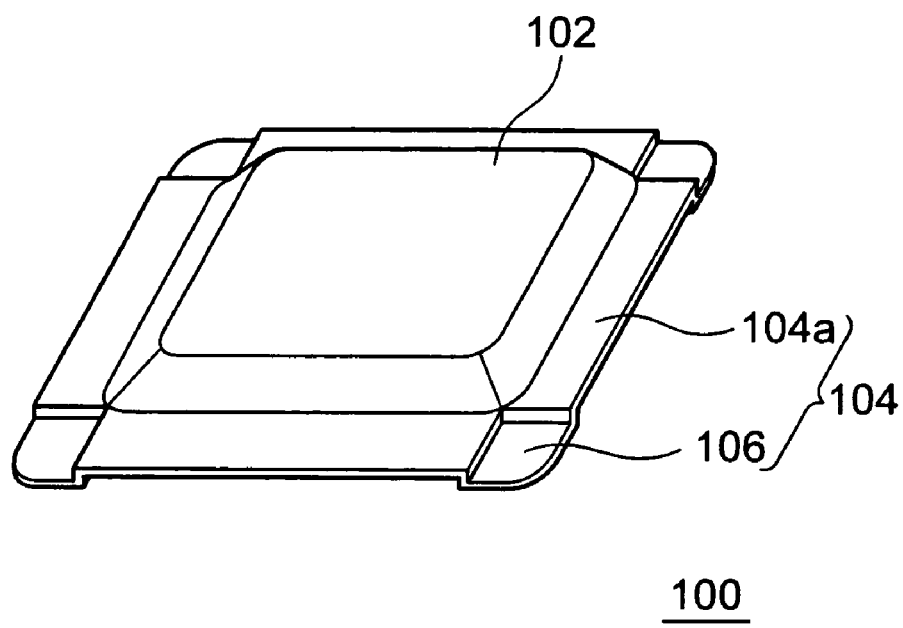
FIGS. 1A and 1B are perspective views showing a configuration of a lid according to an embodiment of the present invention.

Embodiments of the present invention will now be described with reference to the drawings. The same constituent elements are designated with the same reference numerals in all drawings, and some descriptions will not be repeated.

First Embodiment

Figure 1B:
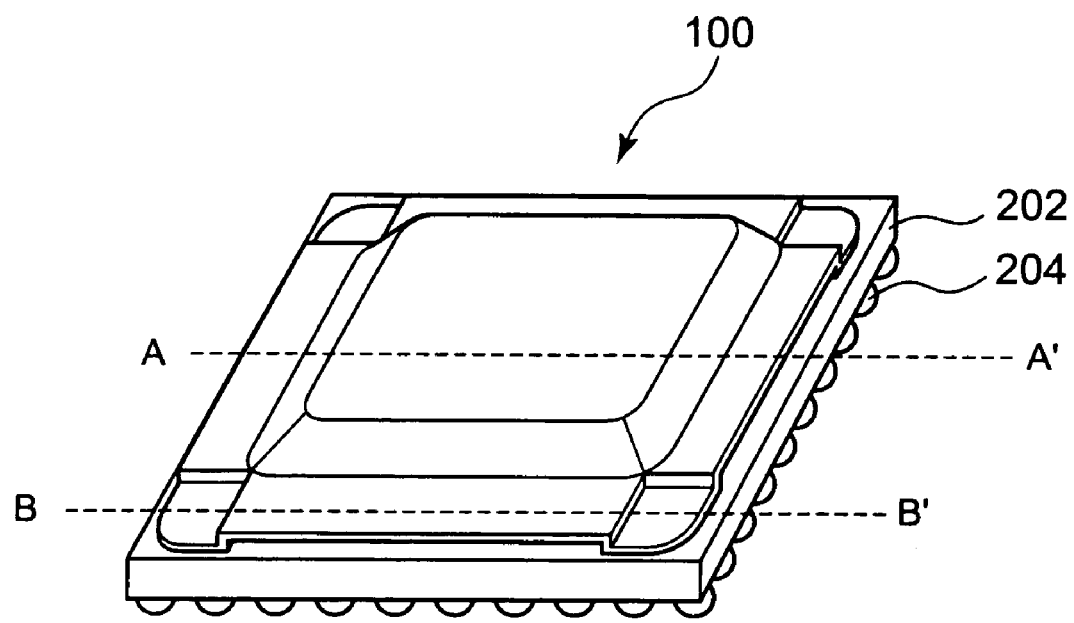
Figure 2A:
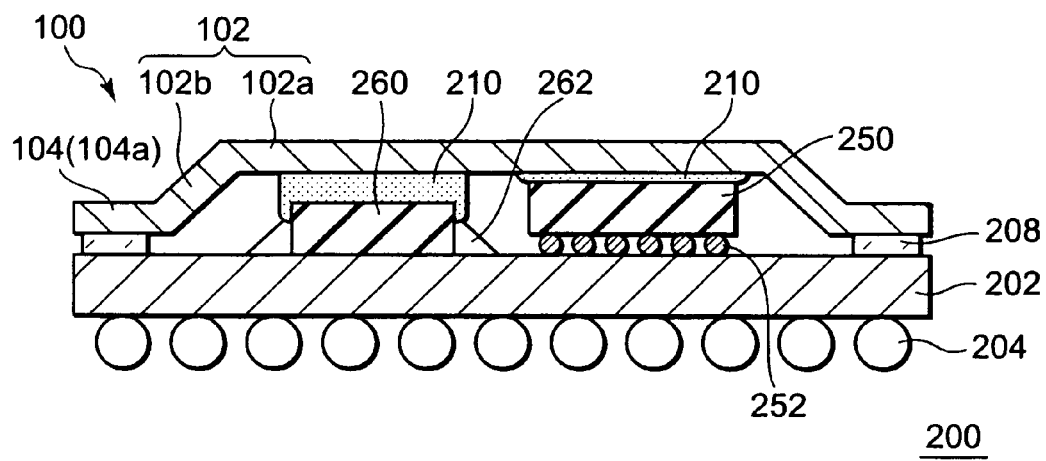
FIGS. 2A and 2B are cross sectional views showing a configuration of an electronic device according to the embodiment of the present invention.
Figure 2B:
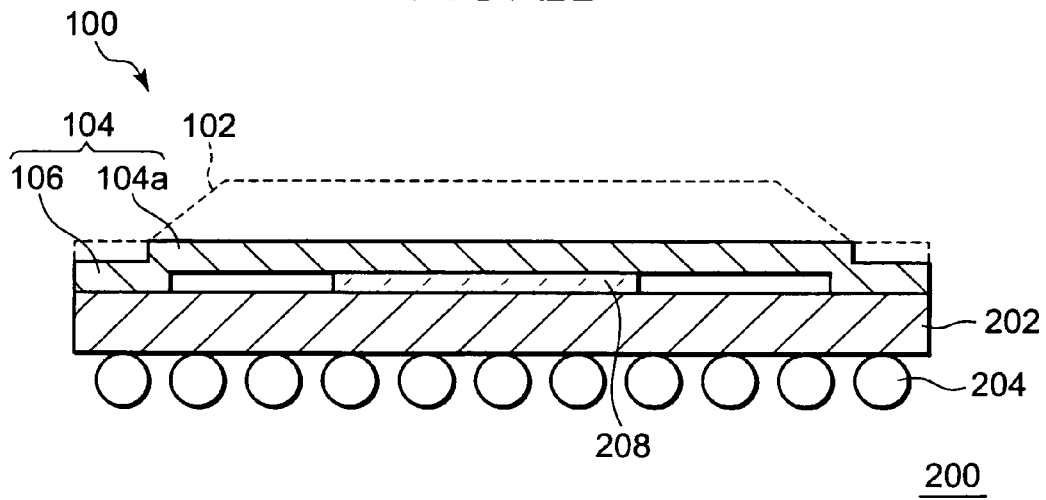

FIGS. 1A and 1B are perspective views showing a configuration of a lid 100 according to the present embodiment. FIG. 1B shows a configuration of an electronic device 200 in which a lid 100 is attached to a substrate 202. FIGS. 2A and 2B are cross sectional views showing a configuration of the electronic device 200. FIG. 2A is an A-A' cross sectional view of FIG. 1B. FIG. 2B is a B-B' cross sectional view of FIG. 1B.

As shown in FIG. 1A, the lid 100 includes: a cover portion 102 protruding in a first direction (upward in FIG. 1A) to cover an electronic component when the lid 100 is arranged on a substrate of an electronic device; and a flange portion 104 arranged at the periphery of the cover portion 102. The flange portion 104 includes a protrusion portion 106 protruding for a predetermined height compared to other areas in a second direction (downward in FIG. 1A) opposite the first direction. In the present embodiment, the lid 100 is adhered to the substrate through an adhesive in an area (hereinafter, also referred to as "adhesion area 104a") other than the protrusion portion 106 of the flange portion 104. The protrusion portion 106 and the adhesion area 104a of the flange portion 104 have flat planar surfaces.

The cover portion 102 includes: a flat planar surface (102a of FIG. 2) positioned above the electronic component when the lid 100 is placed on the substrate of the electronic device; and an inclined surface (102b of FIG. 2) for connecting the planar surface and the flange portion 104. The lid 100 functions as a stiffener (reinforcing plate) and a heat spreader (heat dissipation member). The lid 100 can be constituted by metallic materials such as copper, aluminum, stainless, and alloys of the materials.

As shown in FIGS. 1B and 2, the electronic device 200 includes a substrate 202, a first electronic component 250 and a second electronic component 260 mounted on the substrate 202, and the lid 100. The lid 100 protrudes in a direction opposite the substrate 202 and includes the cover portion 102 covering the first electronic component 250 and the second electronic component 260 and the flange portion 104 arranged at the periphery of the cover portion 102 and adhered to the substrate 202. The protrusion portion 106 protruding for a predetermined height compared to the adhesion area 104a of the flange portion 104 in the direction of the substrate 202 is arranged on the flange portion 104 of the lid 100.

The flange portion 104 of the lid includes a plurality of first areas (protrusion portions 106) and a second area (104a) excluding the plurality of first areas (FIG. 1). The distances between the sides of the plurality of first areas facing one side of the substrate and the one side of the substrate are shorter than the distance between the side of the second area facing the one side of the substrate and the one side of the substrate (FIG. 2). The sides of the first areas facing the one side of the substrate and the one side of the substrate are parallel, and the side of the second area facing the one side of the substrate and the one side of the substrate are parallel (FIG. 2).

In the present embodiment, the heights of the first electronic component 250 and the second electronic component 260 may be different. The height of the first electronic component 250 is higher than the second electronic component 260 herein. The first electronic component 250 and the second electronic component 260 may be, for example, semiconductor chips, passive elements, regulators, and DRAM packages. In the present embodiment, the electronic device 200 may have an SIP (System in Package) configuration in which a plurality of electronic components, such as ASIC (silicon semiconductor) and DRAM (package), with different heights are combined. Although not particularly limited, it is preferable that the distances between the upper sides of the electronic components and the lower side of the cover portion 102 of the lid 100 are about 100 μm or shorter. This can provide excellent heat dissipation.

The substrate 202 may be a wiring substrate including wiring layers or a mother board. In the present embodiment, the substrate 202 may be a multilayer wiring substrate connected with a plurality of wiring layers. Solder balls 204 are arranged on the side opposite the side mounted with the first electronic component 250 and the second electronic component 260 of the substrate 202. In the present embodiment, the first electronic component 250 is electrically connected to the substrate 202 through solder balls 252. The second electronic component 260 is electrically connected to the substrate 202 in flip chip implementation and adhered to the substrate 202 by an underfill 262. The first electronic component 250 and the second electronic component 260 may be electrically connected to the substrate 202 through bonding wires.

In the present embodiment, an adhesive 208 for attaching the substrate 202 and the lid 100 is arranged between the adhesion area 104a of the flange portion 104 of the lid 100 and the substrate 202. A heat dissipation paste 210 for dissipating heat from the electronic components is arranged between the first electronic component 250 as well as the second electronic component 260 and the lower surface of the cover portion 102 of the lid 100. The heat dissipation paste 210 is arranged to contact the first electronic component 250, the second electronic component 260, and the cover portion 102 of the lid 100.

In the present embodiment, a plurality of protrusion portions 106 may be arranged on the flange portion 104 of the lid 100. It is preferable to uniformly arrange the plurality of protrusion portions 106 on the flange portion 104 as much as possible. It is also preferable to arrange the plurality of protrusion portions 106 so that the center of gravity at the vertex of the plurality of protrusion portions 106 corresponds to or is positioned near the center of gravity of the lid 100. The plurality of protrusion portions 106 can be arranged point-symmetric to the center of the lid 100 or line-symmetric to a line passing through the center of the lid 100. For example, when two protrusion portions 106 are arranged in the present embodiment, the protrusion portions 106 can be arranged to face each other on a line passing through the center of the cover portion 102 of the lid 100. As a result of uniformly arranging the protrusion portions 106, the protrusion portions 106 serve as supporting points when the lid 100 is attached to the substrate 202, and the flatness of the lid 100 can be maintained in a more excellent condition. Three or more protrusion portions 106 can be arranged for more stability. For example, when three protrusion portions 106 are arranged, the protrusion portions 106 can be arranged so that the center of gravity of a triangle with the protrusion portions 106 as corners corresponds to or is positioned near the center of gravity of the lid 100.

In the present embodiment, the lid 110 may have a rectangular shape in plan view. The "rectangular shape" herein includes a shape in which the corners are roundly trimmed. In the present embodiment, the lid 100 may have a rectangular shape with corners trimmed roundly. With such a configuration, the plurality of protrusion portions 106 may be arranged at the corners of the flange portion 104. In the example shown in FIGS. 1 and 2, the lid 100 includes four protrusion portions 106, and the protrusion portions 106 are arranged at four corners of the flange portion 104.

The protrusion portions 106 of the flange portion 104 of the lid 100 can be formed by processing, such as bending, forging, squeezing, and half-punching with press work (semi-punching). For example, upon squeezing, the protrusion portions 106 can be formed by selectively pressing the parts where the protrusion portions 106 of the flange portion 104 will be formed and by making the parts protrude for a predetermined height.

Figure 3:
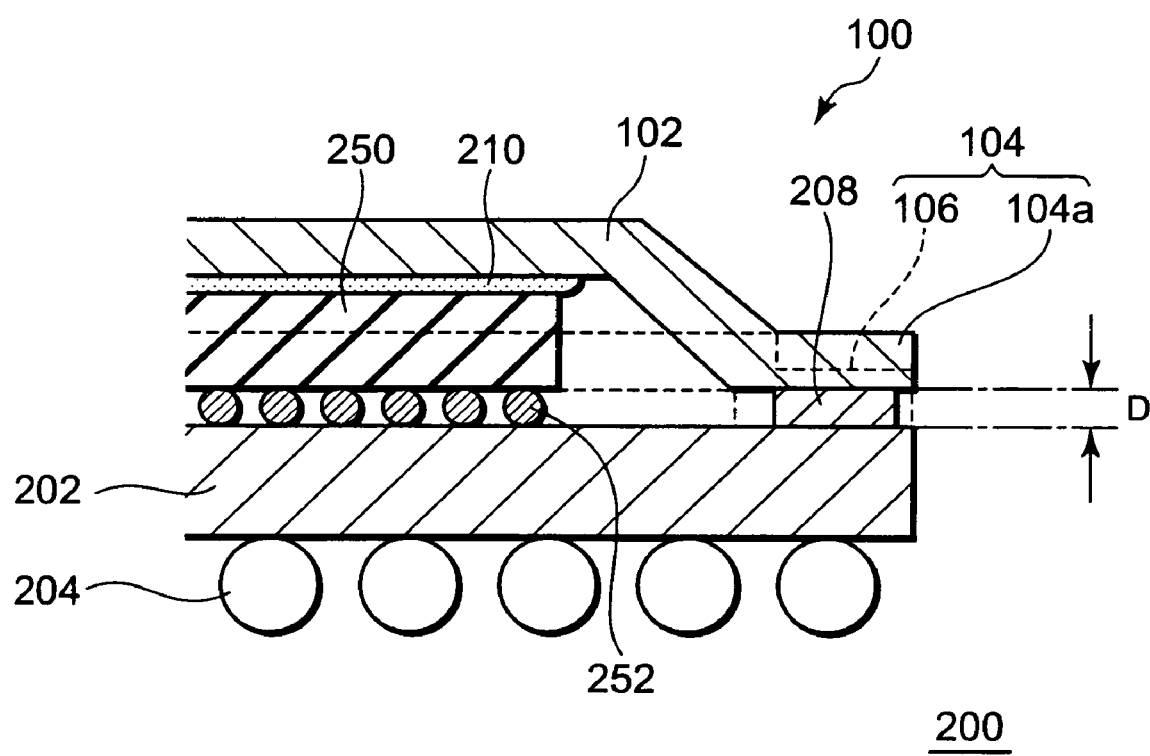
FIG. 3 is a partial cross sectional View showing a state that a protrusion portion of a flange portion of the lid protrudes for a predetermined height D from an adhesion area according to the embodiment of the present invention.
Figure 5:
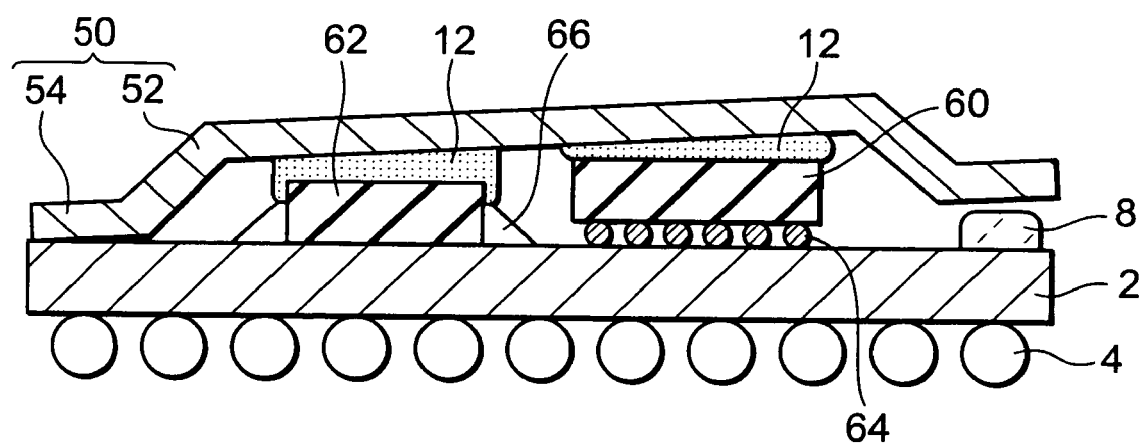
FIG. 5 is a diagram for explaining conventional problems.

FIG. 3 is a partial cross sectional view showing a state that the protrusion portion 106 of the flange portion 104 of the lid 100 protrudes for a predetermined height D from the adhesion area 104a. In the present embodiment, a space between the substrate 202 and the flange portion 104 of the lid 100 is defined by the predetermined height D that the protrusion portion 106 protrudes from the adhesion area 104a. If the predetermined height D that the protrusion portion 106 protrudes from the adhesion area 104a is too large, the adhesive 208 may not sufficiently spread between the adhesion area 104a and the substrate 202. Therefore, the predetermined height D can be decreased so that the adhesive 208 sufficiently spreads between the adhesion area 104a and the substrate 202. On the other hand, if the predetermined height D that the protrusion portion 106 protrudes from the adhesion area 104a is too small, the protrusion portion 106 cannot function as a support, and the flatness of the lid 100 may be affected by the thickness of the adhesive 208. Therefore, the predetermined height D can be increased so that the flatness of the lid 100 is not affected by the thickness of the adhesive 208.

The predetermined height D that the protrusion portion 106 protrudes from the adhesion area 104a can be, for example, 300 μm or less. This allows the adhesive 208 to sufficiently spread between the adhesion area 104a and the substrate 202, and excellent adhesion of the lid 100 and the substrate 202 can be provided. The predetermined height D that the protrusion portion 106 protrudes from the adhesion area 104a can also be, for example, 25 μm or more. This can prevent the lid 100 from tilting due to the adhesive 208 when the lid 100 is attached on the substrate 202.

A manufacturing procedure of the electronic device 200 will now be described. FIG. 4 is a perspective view showing a manufacturing procedure of the electronic device 200.

FIG. 4A shows a configuration in which the first electronic component 250 and the second electronic component 260 are mounted on the substrate 202. In the present embodiment, ground terminals 212 can be arranged on the substrate 202 at the parts corresponding to the protrusion portions 106 when the lid 100 is placed on the substrate 202 later. In this case, the ground terminals 212 are arranged at four corners on the substrate 202. In the configuration herein, although the ground terminals 212 are arranged at all parts (all four corners) corresponding to the protrusion portions 106 when the lid 100 is placed on the substrate 202 later, the ground terminals 212 may be arranged only at some of the parts.

Various connection materials such as an adhesive are applied on the substrate 202 in the configuration shown in FIG. 4A for connection with the lid 100 (FIG. 4B). A conductive resin 214 is applied on the ground terminals 212 on the substrate 202. The conductive resin 214 can be, for example, a silver paste.

The heat dissipation paste 210 is applied on the first electronic component 250 and the second electronic component 260. The heat dissipation paste 210 can be, for example, a resin such as a silver paste kneaded with a metal filler or a highly thermal conductive resin (such as a silicone resin). The adhesive 208 is applied to the parts facing the adhesion area 104a on the substrate 202 when the lid 100 is arranged on the substrate 202 later. The adhesive 208 can be, for example, an epoxy-based resin. Although not shown herein, the first electronic component 250 and the second electronic component 260 may be molded with a mold resin. In that case, the heat dissipation paste 210 such as a silver paste can also be applied on the mold resin.

The lid 100 is attached on the substrate 202 with the various connection materials being applied. Uniform power can be applied to the plurality of protrusion portions 106 of the flange portion 104 of the lid 100. As a result, the lid 100 can be attached to the substrate 202 without tilting. The heat dissipation paste 210 is arranged between the first electronic component 250 as well as the second electronic component 260 and the cover portion 102 of the lid 100, the paste making contact with the components and the portion. The ground terminals 212 of the substrate 202 and the protrusion portions 106 of the flange portion 104 of the lid 100 are electrically connected through the conductive resin 214. The lid 100 is adhered to the substrate 202 at the adhesion area 104a of the flange portion 104 through the adhesive 208. In this way, the electronic device 200 in the configuration shown in FIG. 1B can be obtained.

In the present embodiment, the lid 100 can be adhered to the substrate 202 without being tilted against the substrate 202 by arranging the protrusion portions 106 on the flange portion 104 of the lid 100 to press the lid 100 against the substrate 202, the protrusion portions 106 of the lid 100 serving as supporting points when the lid 100 is attached to the substrate 202. The interval between the substrate 202 and the area (adhesion area 104a) of the flange portion other than the protrusion portions 106 of the lid 100 can be maintained. As a result, the adhesive 208 can be uniformly spread between the substrate 202 and the adhesion area 104a of the lid 100, and the connection reliability of the lid 100 can be secured. The distances between the upper sides of the electronic components and the planar surface 102a of the cover portion 102 of the lid 100 differ depending on the heights of the electronic components. The configuration described above can improve the degree of certainty that the upper sides of the electronic components and the planar surface 102a of the cover portion 102 of the lid 100 are parallel. Therefore, the distances between the upper sides of the electronic components and the planar surface 102a of the cover portion 102 of the lid 100 can be accurately predicted even if electronic components with different heights are mounted on the substrate 202. Thus, the film thickness of the heat dissipation paste 210 can be controlled to reduce the variations in the upper side heights of the heat dissipation paste 210, and the heat dissipation paste 210 and the lid 100 can sufficiently make contact. As a result, excellent heat dissipation characteristics can be provided.

Attaching the lid 100 on the substrate 202 without tilt can satisfy the flatness defined in the product specifications. Making the upper side of the lid 100 flat can also mount a heat sink on the lid 100 through a thermally conductive resin without tilt, the heat sink used for cooling, etc. The heat dissipation effect also improves as the thermally conductive resin between the upper side of the lid 100 and the heat sink can be applied in a uniform thickness.

In the present embodiment, since the lid 100 is connected to ground through the conductive resin 214 and the ground terminals 212, the first electronic component 250 and the second electronic component 260 covered by the lid 100 can be shielded.

Second Embodiment

FIG. 6 is a perspective view showing a manufacturing procedure of an electronic device 400 in the present embodiment. In the present embodiment, the electronic device 400 includes the substrate 202, the electronic components (the first electronic component 250 and the second electronic component 260) mounted on the substrate 202, and a lid 300. The lid 300 includes a cover portion 302 protruding in a direction opposite the substrate 202 and covering the electronic components and a flange portion 304 arranged at the periphery of the cover portion 302. The cover portion 302 of the lid 300 is connected to the ground terminals 212 of the substrate 202 through the conductive resin 214.

A manufacturing procedure of the electronic device 400 will now be described.

FIG. 6A shows a configuration that the first electronic component 250 and the second electronic component 260 are mounted on the substrate 202. In the present embodiment, the ground terminals 212 are arranged at four corners on the substrate 202. Although the ground terminals 212 are arranged at all four corners herein, the ground terminals 212 may be arranged only at some of the corners.

Various connection materials such as an adhesive are applied on the substrate 202 in the configuration shown in FIG. 6A for connection with the lid 300 (FIG. 6B). A conductive resin 214 is applied on the ground terminals 212 on the substrate 202. The conductive resin 214 can be, for example, a silver paste.

The heat dissipation paste 210 is applied on the first electronic component 250 and the second electronic component 260. The heat dissipation paste 210 can be, for example, a resin such as a silver paste kneaded with a metal filler or a highly thermal conductive resin (such as a silicone resin). The adhesive 208 is applied to the parts facing the parts other than the corners of the flange portion 304 when the lid 300 is arranged on the substrate 202 later. The adhesive 208 can be, for example, an epoxy-based resin.

The lid 300 is attached on the substrate 202 with the various connection materials being applied. The heat dissipation paste 210 is arranged between the first electronic component 250 as well as the second electronic component 260 and the cover portion 302 of the lid 300, the paste making contact with the components and the portion. The ground terminals 212 of the substrate 202 and the corners of the flange portion 304 of the lid 300 are electrically connected through the conductive resin 214. The lid 300 is adhered to the substrate 202 at the parts other than the corners of the flange portion 304 through the adhesive 208. In this way, the electronic device 400 in the configuration shown in FIG. 6C can be obtained.

In the present embodiment, since the lid 300 is connected to ground through the conductive resin 214 and the ground terminals 212, the first electronic component 250 and the second electronic component 260 covered by the lid 300 can be shielded.

Although the embodiments of the present invention have been described with reference to the drawings, the embodiments are illustrative examples of the present invention, and various other configurations can be implemented.

What is claimed is:

1. An electronic device, comprising:
    a substrate;
    an electronic component mounted on one side of the substrate; and
    a lid including a cover portion protruding in a direction opposite the one side of the substrate and covering the electronic component, and a flange portion arranged at a periphery of, the cover portion and at least partially adhered to the substrate,
    wherein one side the flange portion of the lid includes a first area and a second area other than the first area, and a distance between a side of the first area facing the one side of the substrate and the one side of the substrate is smaller than the distance between a side of the second area facing the one side of the substrate and the one side of the substrate.

2. The electronic device according to claim 1, wherein the first area is arranged at a corner of the flange portion.

3. The electronic device according to claim 2, wherein a plurality of ones of the first area is arranged at four corners of the flange portion.

4. The electronic device according to claim 1, wherein the first area is electrically connected to a ground terminal formed on the one side of the substrate.

5. The electronic device according to claim 1, wherein an adhesive is arranged between the second area and the one side of the substrate.

6. A lid arranged cm a substrate mounted with an electronic component and covering the electronic component, the lid comprising:
- a cover portion protruding in a first direction so as to cover the electronic component when arranged on the substrate; and
- a flange portion including a protrusion portion arranged at a periphery of the cover portion,
- wherein one side of the flange portion includes a first area and a second area other than the first arca, and a distance between a side of the first area facing the one side of the substrate and the one side of the substrate is smaller than a distance between a side of the second area facing the one side of the substrate and the one side of the substrate.

7. The lid according to claim 6, wherein a plurality of ones of the first area is arranged on the flange portion of the lid.

8. The lid according to claim 7, wherein the plurality of ones of the first area is arranged so that a center of gravity at a vertex of the plurality of ones of the first area corresponds to a center of gravity of the lid.

9. The lid according to claim 7, wherein the lid has a rectangular shape in a plan view, and the plurality of ones of the first area is arranged at corners of the flange portion.

10. The lid according to claim 9, further comprising:
- at least four first areas,
- wherein the first areas are arranged at four corners of the flange portion.

11. The electronic device according to claim 1, wherein said one side of the flange portion of the lid includes a plurality of ones of the first area.

12. The electronic device according to claim 1, wherein a plurality of ones of the first area is arranged on the flange portion of the lid.

13. The electronic device according to claim 12, wherein the plurality of ones of the first area is arranged on the flange portion such that a center of gravity at a vertex of the first areas corresponds to a center of gravity of the lid.

14. The electronic device according to claim 1, wherein a plurality of the electronic components is mounted on the substrate.

15. The electronic device according to claim 14, wherein a height of at least one electronic component of the plurality of the electronic components is higher than a height of other electronic components.

16. The electronic device according to claim 1, further comprising a heat dissipation paste arranged between the electronic component and the lid, the paste being in contact with the electronic component and the lid.

17. The electronic device according to claim 1, wherein, in said one side of the flange portion of the lid, the second area is placed between a plurality of ones of the first area.

18. The electronic device according to claim 1, wherein, with respect to the side of the substrate, a bottom surface of the second area is placed higher than a bottom surface of the first area.

19. The electronic device according to claim 6, wherein, in said one side of the flange portion of the lid, the second area is placed between a plurality of ones of the first area.

20. The electronic device according to claim 6, wherein, with respect to the side of the substrate, a bottom surface of the second area is placed higher than a bottom surface of the first area.

\* \* \* \* \*